(12) United States Patent
Taninaka et al.

(10) Patent No.: US 7,754,512 B2
(45) Date of Patent: Jul. 13, 2010

(54) METHOD OF FABRICATING SEMICONDUCTOR LIGHT-EMITTING DEVICES WITH ISOLATION TRENCHES

(75) Inventors: Masumi Taninaka, Hachioji (JP); Hiroyuki Fujiwara, Hachioji (JP); Susumu Ozawa, Hachioji (JP); Masaharu Nobori, Hachioji (JP)

(73) Assignee: Oki Data Corporation, Tokyo (JP)

( * ) Notice: Subject to any disclaimer, the term of this patent is extended or adjusted under 35 U.S.C. 154(b) by 494 days.

(21) Appl. No.: 11/119,805

(22) Filed: May 3, 2005

(65) Prior Publication Data

US 2005/0189547 A1  Sep. 1, 2005

Related U.S. Application Data

(62) Division of application No. 10/374,081, filed on Feb. 27, 2003, now Pat. No. 6,909,122.

(30) Foreign Application Priority Data

Mar. 26, 2002  (JP) .............................. 2002-085530

(51) Int. Cl.
*H01L 33/00* (2010.01)
*H01L 21/00* (2006.01)
*H01L 33/08* (2010.01)

(52) U.S. Cl. .............................. 438/34; 438/45; 257/79; 257/88; 257/E33.001

(58) Field of Classification Search ................... 257/45, 257/34, 39, 81, 82, 116, 117, 432–437, 749, 257/E25.032, 13, 79, 88–103, 594, 918, E51.018, 257/E51.019, E51.022, E51.026, E33.001–E33.077, 257/E31.099, E31.105, E25.019, E25.028; 438/22–47, FOR. 157, FOR. 287, FOR. 416, 438/FOR. 417
See application file for complete search history.

(56) References Cited

U.S. PATENT DOCUMENTS

| 3,500,139 | A |   | 3/1970  | Brebisson et al. |
| 3,887,404 | A | * | 6/1975  | Chane .......................... 438/704 |
| 4,032,944 | A |   | 6/1977  | van Dongen et al. |
| 4,275,403 | A |   | 6/1981  | Lebailly |
| 4,335,501 | A | * | 6/1982  | Wickenden et al. ........... 438/28 |
| 4,747,109 | A |   | 5/1988  | Taneya et al. |
| 4,845,405 | A | * | 7/1989  | Yamane et al. .............. 313/500 |
| 4,984,035 | A | * | 1/1991  | Kanzawa et al. .............. 257/93 |
| 5,073,806 | A |   | 12/1991 | Idei |
| 5,132,751 | A |   | 7/1992  | Shibata et al. |
| 5,196,718 | A | * | 3/1993  | Sasagawa ..................... 257/88 |

(Continued)

FOREIGN PATENT DOCUMENTS

JP  6-326357  11/1994

*Primary Examiner*—W. David Coleman
*Assistant Examiner*—Maliheh Malek
(74) *Attorney, Agent, or Firm*—Rabin & Berdo, P.C.

(57) ABSTRACT

According to the present invention, a light-emitting semiconductor device has light-emitting elements separated by isolation trenches, preferably on two sides of each light-emitting element. The device may be fabricated by forming a single band-shaped diffusion region, then forming trenches that divide the diffusion region into multiple regions, or by forming individual diffusion regions and then forming trenches between them. The trenches prevent overlap between adjacent light-emitting elements, regardless of their junction depth, enabling a high-density array to be fabricated while maintaining adequate junction depth.

18 Claims, 18 Drawing Sheets

U.S. PATENT DOCUMENTS

| | | | |
|---|---|---|---|
| 5,258,320 A * | 11/1993 | Zavracky et al. | 438/27 |
| 5,260,588 A | 11/1993 | Ohta et al. | |
| 5,373,174 A * | 12/1994 | Yamamoto | 257/88 |
| 5,386,139 A | 1/1995 | Idei et al. | |
| 5,406,095 A | 4/1995 | Koyama et al. | |
| 5,449,926 A | 9/1995 | Holm et al. | |
| 5,663,581 A | 9/1997 | Holm et al. | |
| 5,665,985 A | 9/1997 | Iwata | |
| 5,684,819 A | 11/1997 | Zirngibl | |
| 5,729,563 A | 3/1998 | Wang et al. | |
| 5,952,680 A * | 9/1999 | Strite | 257/88 |
| 5,955,747 A * | 9/1999 | Ogihara et al. | 257/88 |
| 6,023,104 A * | 2/2000 | Koizumi et al. | 257/797 |
| 6,054,724 A * | 4/2000 | Ogihara et al. | 257/88 |
| 6,083,769 A * | 7/2000 | Kurahashi | 438/33 |
| 6,114,737 A * | 9/2000 | Tonai | 257/434 |
| 6,136,627 A * | 10/2000 | Ogihara et al. | 438/45 |
| 6,140,156 A * | 10/2000 | Tsai | 438/148 |
| 6,191,438 B1 * | 2/2001 | Ikehara et al. | 257/99 |
| 6,211,537 B1 * | 4/2001 | Shimizu et al. | 257/88 |
| 6,271,051 B1 * | 8/2001 | Ogihara et al. | 438/45 |
| 6,313,483 B1 * | 11/2001 | Ogihara et al. | 257/79 |
| 6,342,402 B1 * | 1/2002 | Tajiri et al. | 438/34 |
| 6,388,696 B1 * | 5/2002 | Taninaka et al. | 347/238 |
| 6,433,367 B1 * | 8/2002 | Tohyama et al. | 257/88 |
| 6,583,446 B1 * | 6/2003 | Taninaka et al. | 257/93 |
| 6,717,184 B2 * | 4/2004 | Taninaka et al. | 257/93 |
| 6,765,235 B2 * | 7/2004 | Taninaka et al. | 257/88 |
| 6,781,246 B2 * | 8/2004 | Fujiwara et al. | 257/780 |
| 6,858,875 B2 * | 2/2005 | Hamano et al. | 257/88 |
| 6,909,122 B2 * | 6/2005 | Taninaka et al. | 257/93 |
| 6,984,841 B2 * | 1/2006 | Tsuda et al. | 257/12 |
| 7,026,659 B2 * | 4/2006 | Slater et al. | 257/98 |
| 7,456,449 B2 * | 11/2008 | Fujiwara et al. | 257/231 |
| 7,486,307 B2 * | 2/2009 | Ogihara et al. | 347/238 |
| 2002/0139987 A1 * | 10/2002 | Collins et al. | 257/88 |
| 2002/0153529 A1 * | 10/2002 | Shie | 257/88 |
| 2003/0160255 A1 * | 8/2003 | Taninaka et al. | 257/88 |
| 2003/0183831 A1 * | 10/2003 | Taninaka et al. | 257/93 |
| 2004/0021146 A1 * | 2/2004 | Fujiwara et al. | 257/93 |
| 2005/0127389 A1 * | 6/2005 | Fujiwara et al. | 257/99 |

* cited by examiner

METHOD OF FABRICATING SEMICONDUCTOR LIGHT-EMITTING DEVICES WITH ISOLATION TRENCHES

This is a Divisional of U.S. application Ser. No.: 10/374,081, filed Feb. 27, 2003, now U.S. Pat. No.: 6,909,122 B2, the subject matter of which is incorporated herein by reference.

BACKGROUND OF THE INVENTION

1. Field of the Invention

The present invention relates to a semiconductor light-emitting device having a plurality of light-emitting regions formed by diffusion of an impurity of a second conductive type into a substrate of a first conductive type, and more particularly to a structure and fabrication method that enable the light-emitting regions to be arranged more densely than before.

2. Description of the Related Art

Known semiconductor light-emitting devices include arrays of light-emitting elements such as arrays of light-emitting diodes, generally referred to as LED arrays. LED arrays formed on semiconductor chips are used as light sources in, for example, electrophotographic printers.

FIGS. 28A and 28B show an LED array disclosed on page 60 of the book *LED Purinta no Sekkei* (Design of LED Printers), published by Torikeppusu. FIG. 28A shows the cross-sectional structure of the LED array; FIG. 28B is a plan view showing the chip pattern.

The LED array shown in these drawings has a plurality of light-emitting regions 3. The light-emitting regions 3 are formed by growing an epitaxial layer 2 of a first conductive type (an n-type $GaAs_{0.6}P_{0.4}$ layer) on a gallium-arsenide (GaAs) substrate 1 of the first conductive type (n-type), then selectively diffusing an impurity of a second conductive type (p-type), such as zinc (Zn), into the epitaxial layer 2. Each light-emitting region 3 has an individual aluminum (Al) electrode 4, and the light-emitting regions 3 share a common gold-germanium-nickel (Au—Ge—Ni) electrode 5. The individual electrodes 4 are formed on an insulating layer 6 deposited on the epitaxial layer 2, and make electrical contact with the surfaces of the light-emitting regions 3. The common electrode 5 is formed on the underside of the n-type GaAs substrate 1.

There is an increasing demand for electrophotographic printers capable of printing very clear images. Improved clarity is obtained by increasing the resolution of the printer. For an LED printer, this means increasing the resolution of the LED arrays used as light sources, by increasing the density of the layout of their light-emitting elements.

FIG. 29 illustrates relationships between the size and density of the light-emitting elements in an LED array. FIG. 30 shows the relationship between the width of the diffusion areas and the diffusion depth, indicating width in arbitrary units on the horizontal axis, and depth in arbitrary units on the vertical axis.

In the arrays shown on the left in FIG. 29, the width (in the array direction) of a light-emitting region 3 is equal to the distance between two adjacent light-emitting regions 3. The resolution of the array is equal to twice this value. Accordingly, to increase the resolution, it is necessary to decrease the size of the light-emitting regions 3, which entails decreasing the size of the diffusion windows through which the light-emitting regions 3 are formed. As shown in FIG. 30, however, if the size of the light-emitting regions 3 is decreased beyond a certain point, the diffusion depth must also decrease. Because of inadequate diffusion depth, the light-emitting regions 3 then fail to emit the desired amount of light.

Referring once more to FIG. 29, it can be seen that as the size of the light-emitting regions 3, 3a, 3b is decreased to increase the density of the array, eventually the light-emitting regions become too small to be formed with adequate depth. If the density is increased without changing the size of the light-emitting regions 3, however, it soon becomes impossible to fabricate the array because adjacent light-emitting regions overlap.

SUMMARY OF THE INVENTION

An object of the present invention is to provide a semiconductor device including a dense array of light-emitting elements having an adequate diffusion depth.

According to the present invention, the individual light-emitting elements are separated by isolation trenches. The isolation trenches are preferably formed on only two sides of each light-emitting element. The trenches enable the light-emitting elements to be formed with a suitable size and adequate depth.

The light-emitting elements may be formed by creating a single band-shaped diffusion region with adequate depth, then forming isolation trenches that divide the single diffusion region into multiple diffusion regions, each of which becomes a light-emitting element having a suitable size. In this case the isolation trenches must be deeper than the diffusion depth.

Alternatively, individual diffusion regions may be formed, and then isolation trenches may be formed between them, preferably removing parts of the sides of the diffusion regions. In this case the isolation trenches may be either deeper or shallower than the diffusion depth.

The isolation trenches reliably prevent overlap between adjacent light-emitting elements, regardless of their diffusion depth and associated lateral diffusion width. A high-density array can accordingly be formed while maintaining adequate junction depth.

BRIEF DESCRIPTION OF THE DRAWINGS

In the attached drawings:

FIGS. 2A to 9A are plan views illustrating steps in a fabrication process for the LED array in FIGS. 1A and 1B;

FIGS. 2B to 9B are sectional views through line A-A' in FIGS. 2A to 9A, respectively;

FIGS. 11A to 18A are plan views illustrating steps in a fabrication process for the LED array in FIGS. 10A and 10B;

FIGS. 11B to 18B are sectional views through line A-A' in FIGS. 11A to 18A, respectively;

FIGS. 20A to 27A are plan views illustrating steps in a fabrication process for the LED array in FIGS. 19A and 19B;

FIGS. 20B to 27B are sectional views through line A-A' in FIGS. 20A to 27A, respectively;

DETAILED DESCRIPTION OF THE INVENTION

Figure 1A:
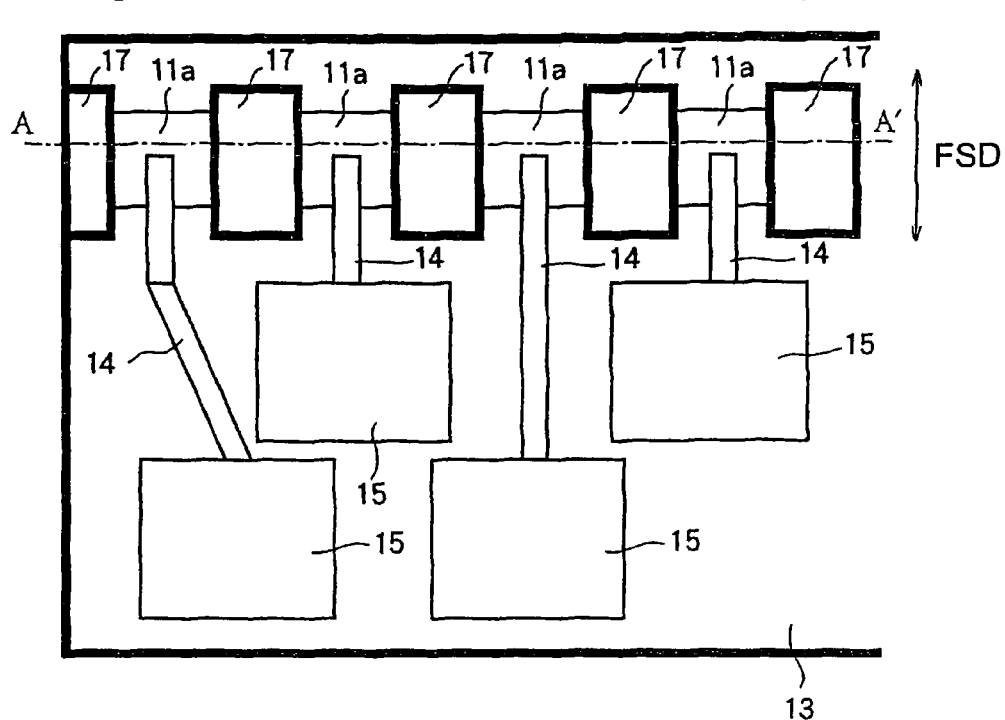
FIG. 1A is a plan view of an LED array according to a first embodiment of the invention.

Preferred embodiments of the invention will now be described with reference to the attached drawings, in which like elements are indicated by like reference characters. Although the illustrated embodiments are LED arrays, the invention is not limited to LED arrays.

FIRST EMBODIMENT

Figure 1B:
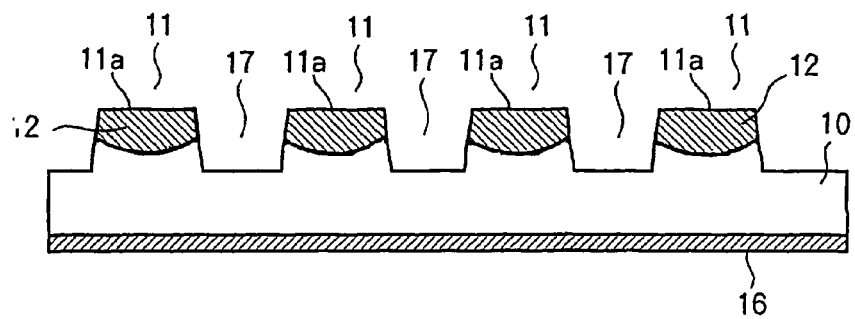
FIG. 1B is a sectional view through line A-A' in FIG. 1A.

FIG. 1A is a plan view of a first embodiment of the invention. FIG. 1B is a sectional view through line A-A'.

The LED array shown in these drawings has a semiconductor substrate 10 of a first conductive type (n-type) in which a plurality of light-emitting regions, more specifically light-emitting diodes (LEDs) 11, are formed by diffusion of an impurity of a second conductive type (p-type). The plurality of light-emitting regions are disposed in an array along an array direction ARD. A pn junction is created at the interface between the diffusion region 12 of each light-emitting diode 11 and the semiconductor substrate 10. Between each pair of mutually adjacent light-emitting diodes 11, an isolation trench 17 is provided to separate their two diffusion regions 12. Each isolation trench 17 extends in a first direction FSD that is perpendicular to the array direction ARD.

The isolation trench 17 has a first width at a surface defined by the light-emitting diodes, and a second width at a floor of the trench. The first and second widths are measured in a same direction, with the first width being greater than the second width.

Except where the light-emitting diodes 11 and isolation trenches 17 are formed, the semiconductor substrate 10 is covered by an insulating layer 13. A plurality of p-electrodes 14 and p-electrode pads 15 are formed on the insulating layer 13, each light-emitting diode 11 being electrically coupled by a p-electrode 14 to a p-electrode pad 15. An n-electrode 16 is formed on the underside of the semiconductor substrate 10. A light-emitting diode 11 emits light from its pn junction when a forward voltage is applied between its p-electrode pad 15 and the n-electrode 16. The light emitted through the surface 11a of the light-emitting diode 11 may be used in electrophotographic printing.

As shown in FIG. 1B, the isolation trenches 17 are deeper than the diffusion regions 12 of the light-emitting diodes 11. The dimensions of the light-emitting diodes 11, that is, the area of the surface 11a and the depth of the diffusion region 12, are selected to provide a desired amount of light emission. The depth of the isolation trenches 17 is selected to exceed the depth of the diffusion region 12.

A fabrication process for the first embodiment will now be described.

Figure 2A:
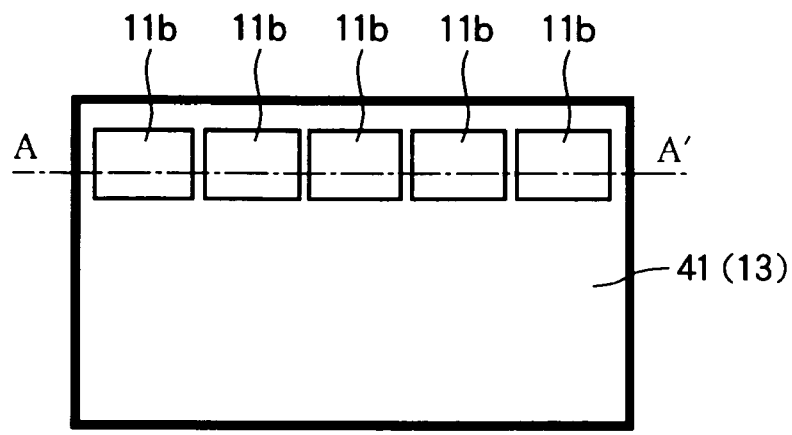
Figure 2B:
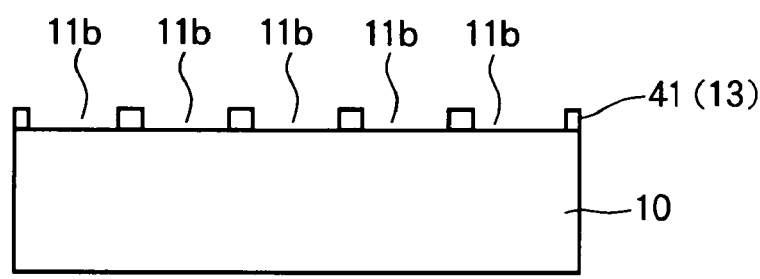

Referring to FIGS. 2A and 2B, a diffusion mask 41 having a plurality of diffusion windows 11b is formed on the surface of the semiconductor substrate 10. The diffusion mask 41 may be used as the insulating layer 13 in the finished device. Each diffusion window 11b corresponds to one light-emitting diode 11, the diffusion window 11b being large enough to permit formation of the surface 11a of the light-emitting diode 11 shown in FIGS. 1A and 1B. In particular, the width of the diffusion window 11b in the array direction (the direction parallel to line A-A') exceeds the width of the surface 11a in this direction. The diffusion mask 41 may be, for example, a silicon nitride (SiN) film five hundred to three thousand angstroms (500 Å to 3000 Å) thick formed by chemical vapor deposition (CVD). The diffusion windows 11b may be formed by photolithography and etching.

Figure 3A:
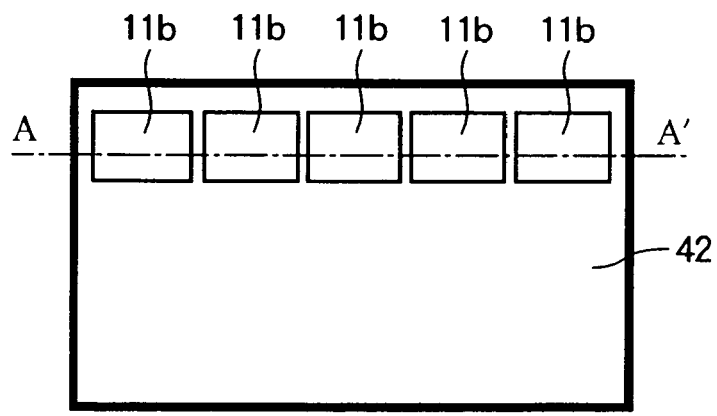
Figure 3B:
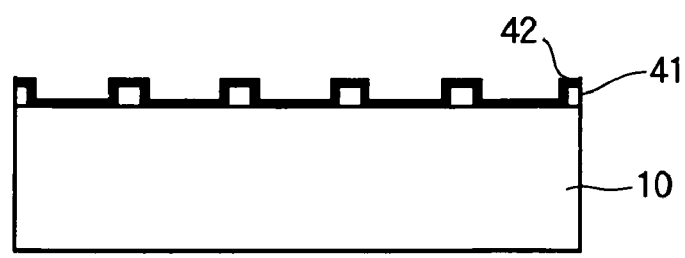

Referring to FIGS. 3A and 3B, a diffusion source 42 is deposited on the diffusion mask 41 and the diffusion windows 11b. The diffusion source 42 may be, for example, an insulating film doped with zinc, such as a film of zinc oxide and silicon dioxide ($ZnO-SiO_2$), likewise 500 Å to 3000 Å thick. The diffusion source 42 may be formed by sputtering.

Figure 4A:
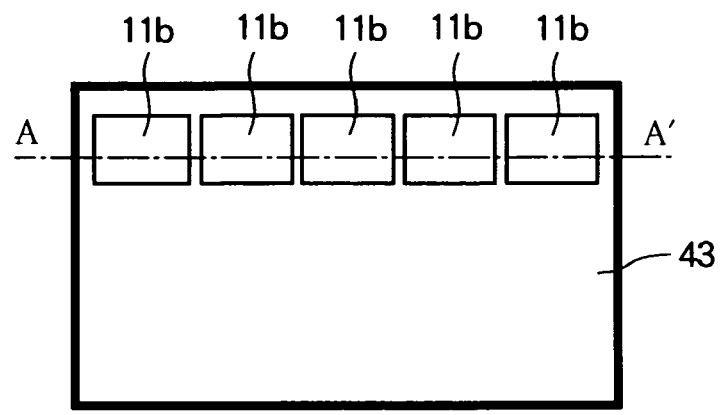
Figure 4B:
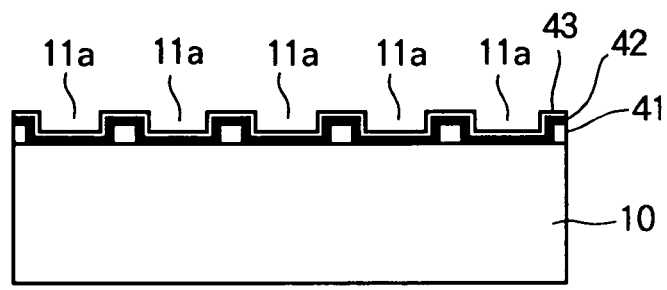

Referring to FIGS. 4A and 4B, an anneal cap 43 is formed on the diffusion source 42. The anneal cap 43 may be, for example, an aluminum nitride (AlN) film 500 Å to 3000 Å thick, which can be formed by sputtering.

Figure 5A:
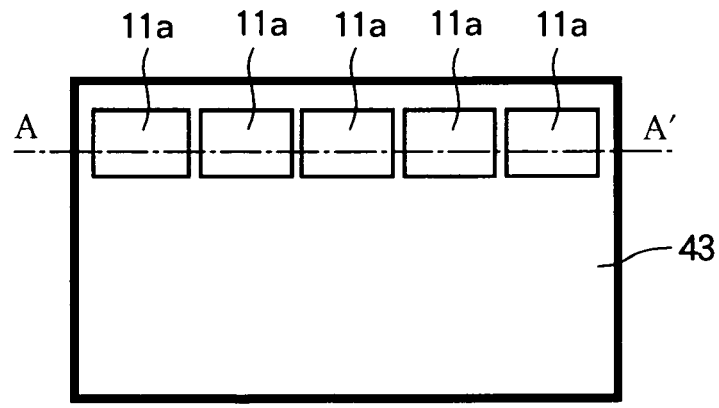
Figure 5B:
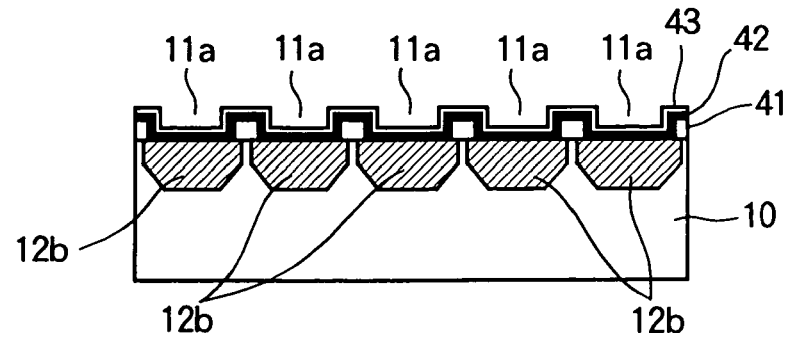

Referring to FIGS. 5A and 5B, the device is annealed in, for example, a nitrogen atmosphere for one hour, causing a p-type impurity (zinc) to diffuse through the diffusion windows 11b to a desired depth into the semiconductor substrate 10, forming diffusion regions 12b. Diffusion proceeds laterally as well as vertically, so the diffusion regions 12b have a rounded shape (in cross-section, shown only in FIG. 1B). The boundary between each diffusion region 12b and the semiconductor substrate 10 becomes a pn junction. The annealing conditions are selected to produce a desired pn junction depth, regardless of how closely lateral diffusion causes adjacent diffusion regions 12b to approach each other. The diffusion depth or pn junction depth may be, for example, substantially one micrometer (1.0 μm).

Figure 6A:
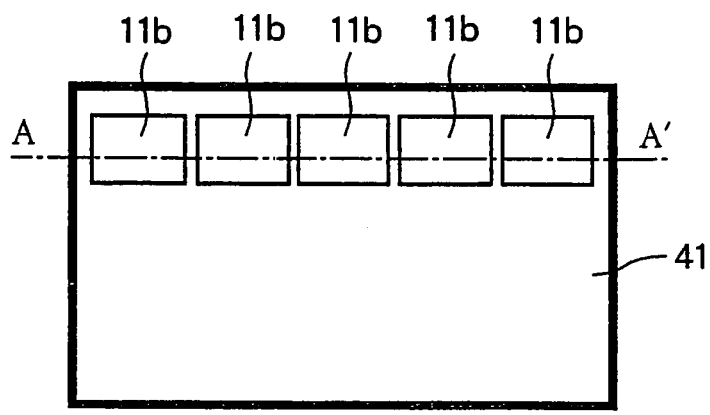
Figure 6B:
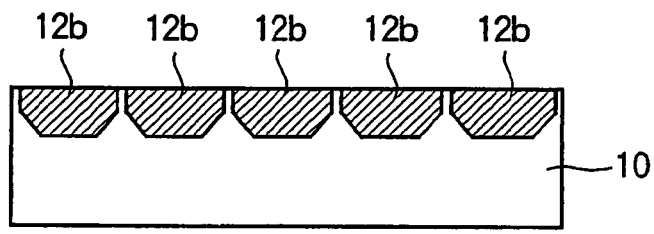

Referring to FIGS. 6A and 6B, the diffusion source 42 and anneal cap 43 are now removed, exposing the diffusion mask 41 and the surfaces of the diffusion regions 12b. The diffusion source 42 and anneal cap 43 may be removed by etching.

Figure 7A:
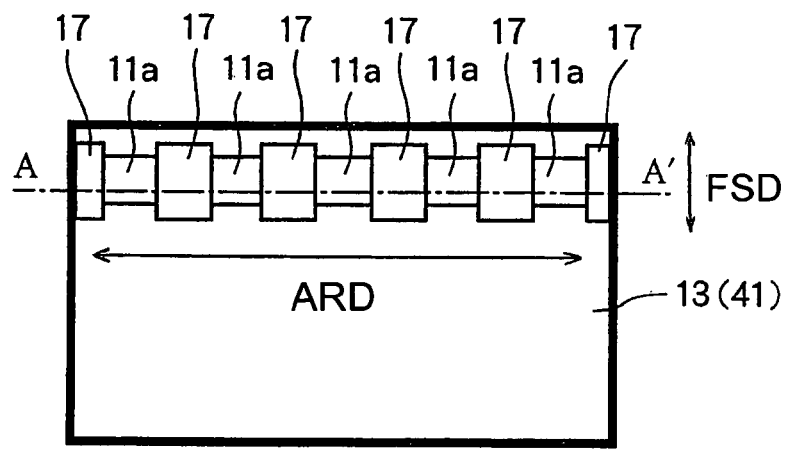
Figure 7B:
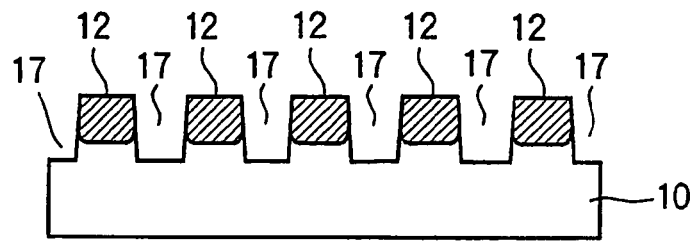

Referring to FIGS. 7A and 7B, the isolation trenches 17 are now formed by, for example, photolithography and etching. Formation of the isolation trenches 17 removes side material from the diffusion regions, reducing their width so that the surfaces 11a of the remaining diffusion regions 12 have the desired size. As shown in FIG. 7A, the isolation trenches 17, taken from a plan view of the semiconductor substrate 10, cuts through the diffusion regions 12 in the first direction FSD. The first direction FSD is a direction that is parallel to the top surface of the semiconductor substrate 10. FIG. 7A further illustrates that the first direction FSD is perpendicular to the array direction ARD.

Figure 8A:
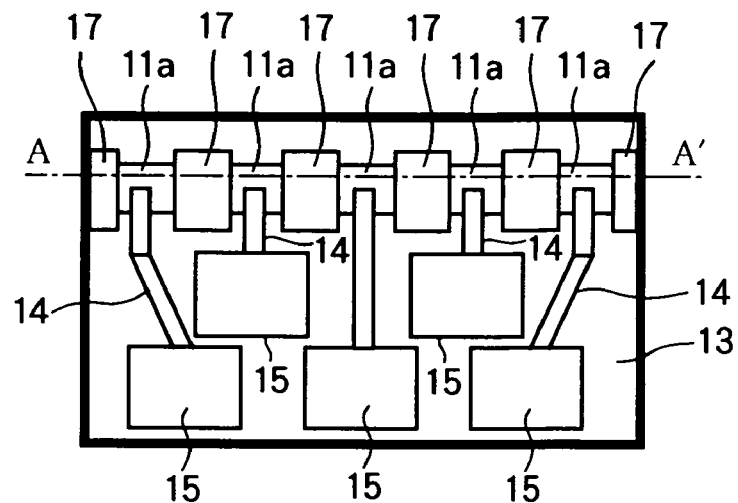
Figure 8B:
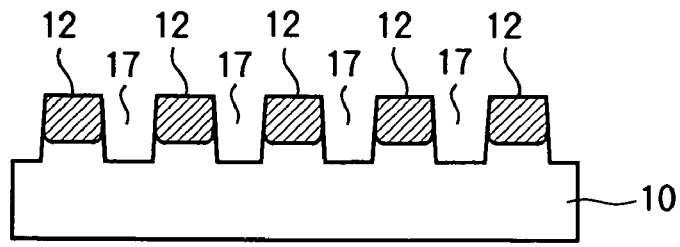

Referring to FIGS. 8A and 8B, the p-electrodes 14 and p-electrode pads 15 are formed by, for example, evaporation deposition of a film of aluminum, followed by photolithography, etching, and sintering.

Figure 9A:
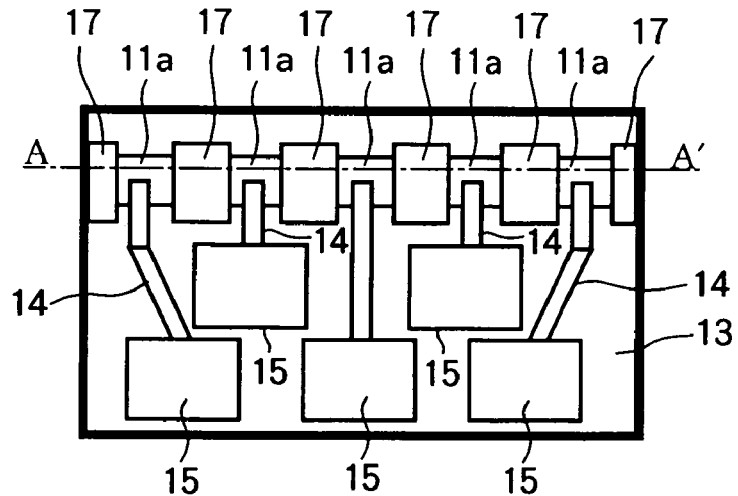
Figure 9B:
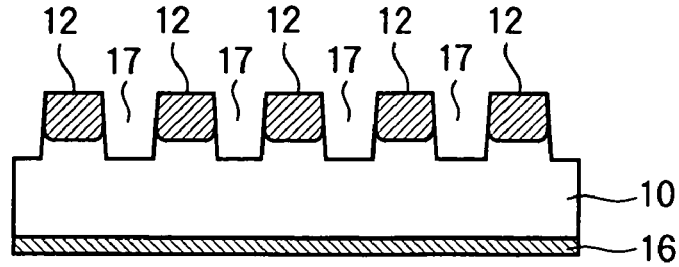

Referring to FIGS. 9A and 9B, the n-electrode 16 is formed on the underside of the semiconductor substrate 10. The n-electrode 16 may comprise, for example, a gold alloy, and may be formed by evaporation deposition.

The process described above makes it possible to form light-emitting diodes 11 with a very small surface 11a, and to place these light-emitting diodes 11 very close together, while maintaining electrical isolation between adjacent light-emitting diodes 11 and while providing an adequate pn junction depth.

Although it would be possible to surround each light-emitting diode 11 with isolation trenches on all four sides, there are advantages in forming the isolation trenches 17 on only two sides of each light-emitting diode 11.

One advantage is that more of the pn junction is left intact. The pn junction is present in the area directly below the surface 11a, and also on the two sides of the diffusion region 12 extending parallel to the array axis, since no isolation trenches 17 are formed on these two sides. Considerable light is emitted from these two side regions, where the pn junction extends toward the surface of the device. If isolation trenches were to be formed on all four sides of the light-emitting diode 11, the pn junction would be removed from all four sides, and less total light would be omitted.

Another advantage is that if isolation trenches were to be formed on all four sides, the p-electrode 14 would have to cross an isolation trench to reach the surface 11a of the light-emitting diode 11. Such a crossing would increase the likelihood of electrical discontinuities in the p-electrode 14. In the first embodiment, the p-electrode 14 proceeds from the surface of the insulating layer 13 directly onto the surface 11a of the light-emitting diode 11 without having to cross an isolation trench 17.

Another advantage is that the dimensions in the vertical direction in FIG. 1A (orthogonal to the array direction) can easily be reduced to shrink the size of the LED array chip, since it is not necessary to reduce the width of any of the isolation trenches. If there were isolation trenches on all four sides of the light-emitting diodes 11, it would be necessary to reduce the width of isolation trenches crossed by p-electrodes, further increasing the likelihood of an electrical discontinuity.

Incidentally, it is also possible to reduce the horizontal dimensions of the array in FIG. 1A, by reducing the width of the diffusion regions 12 without reducing the width of the trenches 17, thus avoiding the difficulty of forming extremely narrow trenches. Reducing the width of the diffusion regions does not cause any structural problems.

Next, a second embodiment will be described. The second embodiment is also an LED array.

Figure 10A:
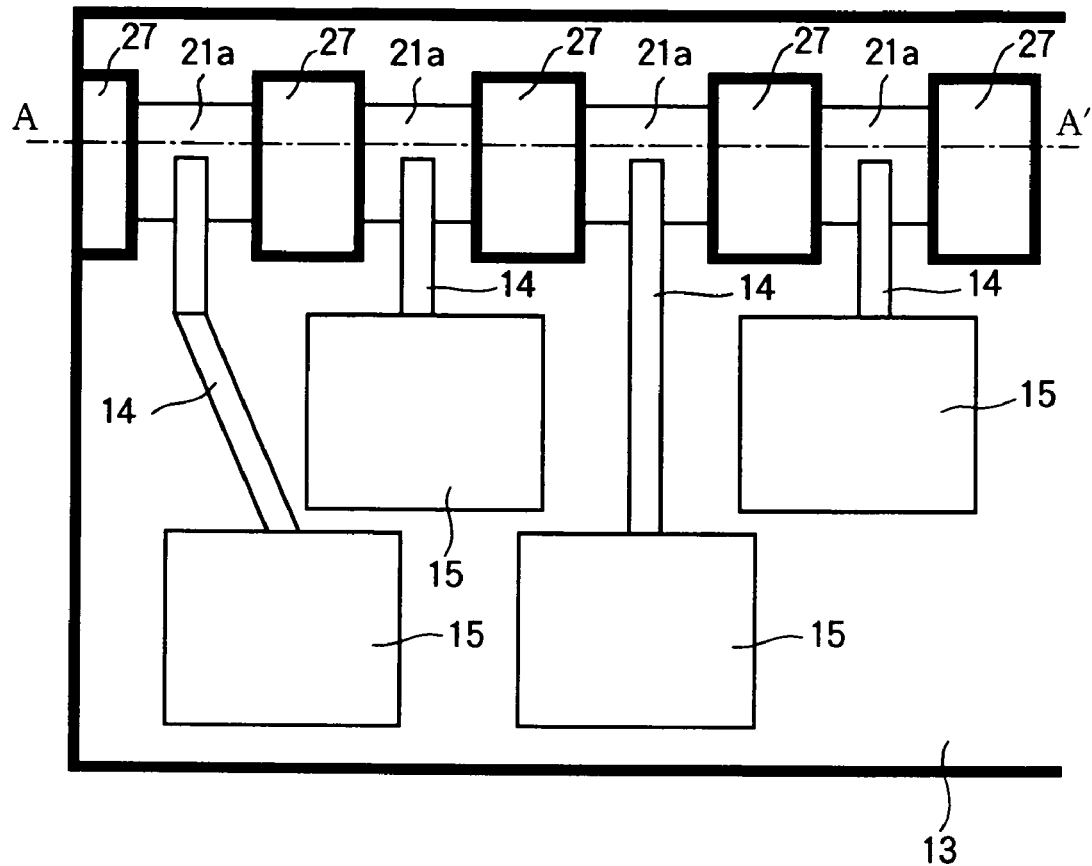
FIG. 10A is a plan view of an LED array according to a second embodiment of the invention.

Referring to FIG. 10A, the second embodiment has the same plan-view layout as the first embodiment, with the surfaces 21a of the light-emitting diodes separated by isolation trenches 27.

Figure 10B:
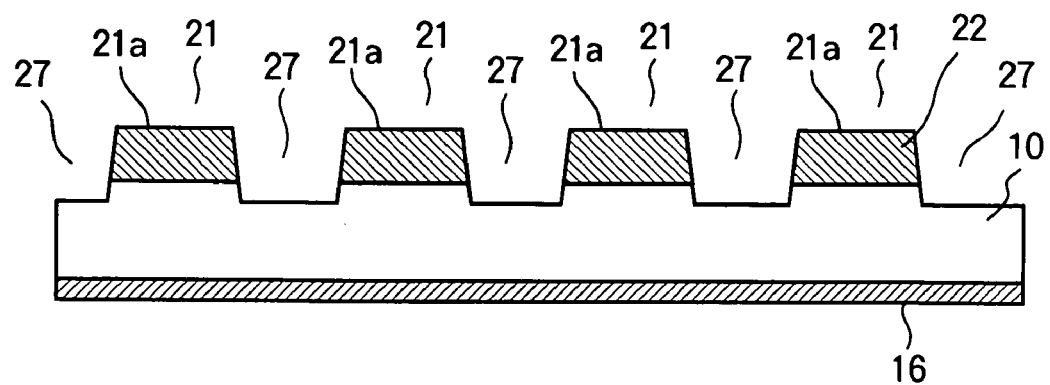
FIG. 10B is a sectional view through line A-A' in FIG. 10A.

Referring to FIG. 10B, the light-emitting diodes 21 in the second embodiment differ from the light-emitting diodes in the first embodiment in that the pn junction at the bottom of each light-emitting diode 21 extends straight across from the isolation trench 27 on one side to the isolation trench 27 on the other side, without having the rounded cross-sectional shape seen in the first embodiment.

A fabrication process for the second embodiment will now be described.

Figure 11A:
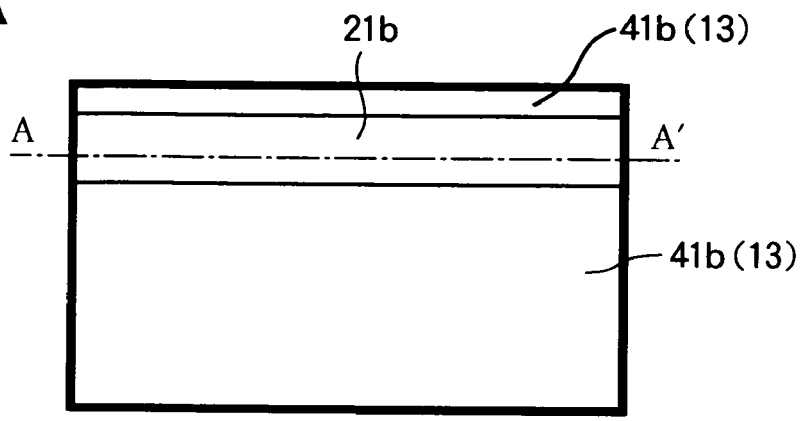
Figure 11B:
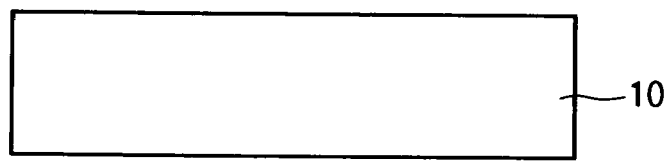

Referring to FIGS. 11A and 11B, a diffusion mask 41b is formed on the surface of the semiconductor substrate 10. The diffusion mask 41b may be used as the insulating layer 13 in the finished device. The diffusion mask 41b has a single diffusion window 21b extending from one end of the device to the other. The diffusion mask 41b may be, for example, a silicon nitride film 500 Å to 3000 Å thick formed by chemical vapor deposition. The diffusion window 21b may be formed by photolithography and etching.

Figure 12A:
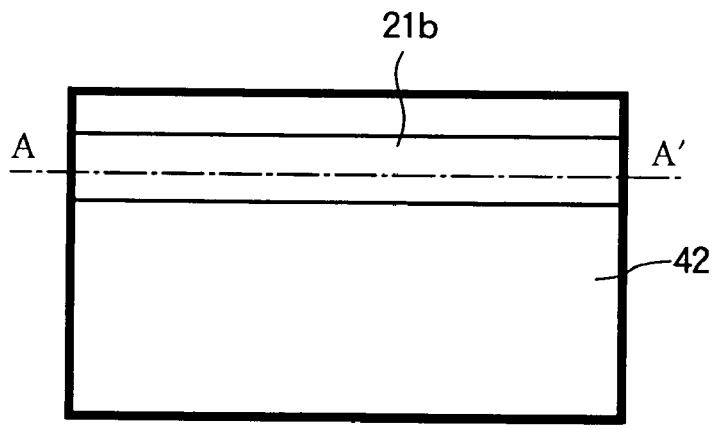
Figure 12B:
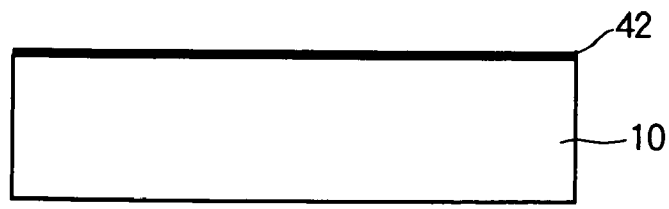

Referring to FIGS. 12A and 12B, a diffusion source 42 is deposited on the diffusion mask 41 and the diffusion window 21b. The diffusion source 42 may be, for example, a sputtered ZnO—SiO$_2$ film 500 Å to 3000 Å thick.

Figure 13A:
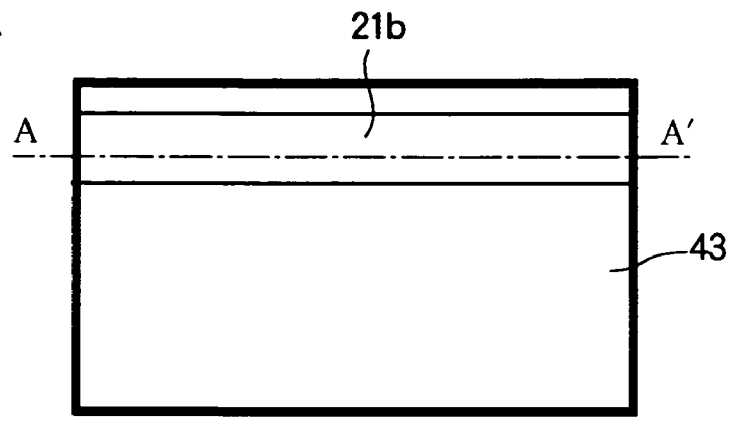
Figure 13B:
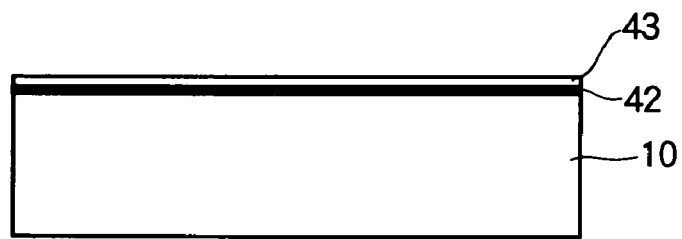

Referring to FIGS. 13A and 13B, an anneal cap 43 is formed on the diffusion source 42. The anneal cap 43 may be, for example, a sputtered aluminum nitride film 500 Å to 3000 Å thick.

Figure 14A:
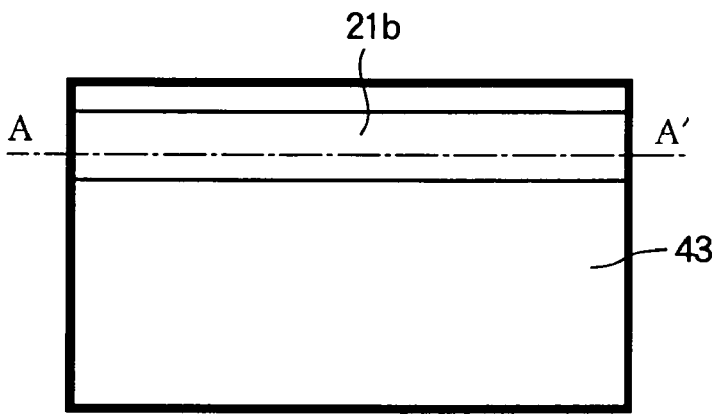
Figure 14B:
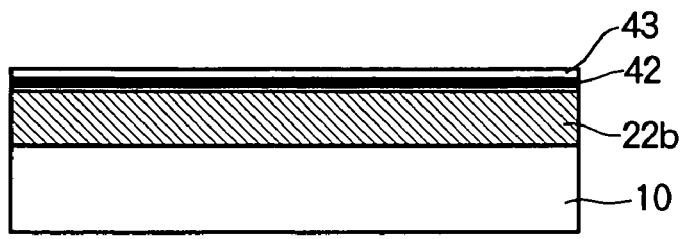

Referring to FIGS. 14A and 14B, the device is annealed in, for example, a nitrogen atmosphere for one hour, causing a p-type impurity (e.g., zinc) to diffuse through the diffusion window 21b to a desired depth in the semiconductor substrate 10, such as a depth of substantially 1.0 µm, forming a diffusion region 22b.

Figure 15A:
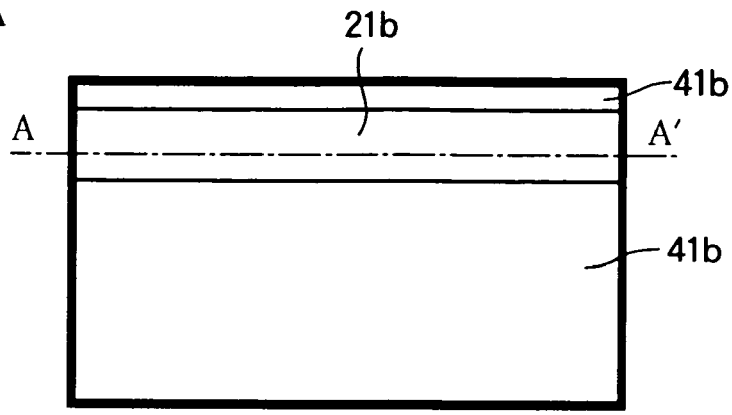
Figure 15B:
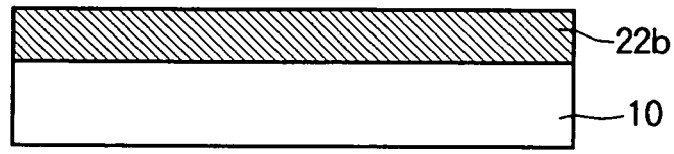

Referring to FIGS. 15A and 15B, the diffusion source 42 and anneal cap 43 are now removed, exposing the diffusion mask 41b and the surface of the diffusion region 22b. The diffusion source 42 and anneal cap 43 may be removed by etching.

Figure 16A:
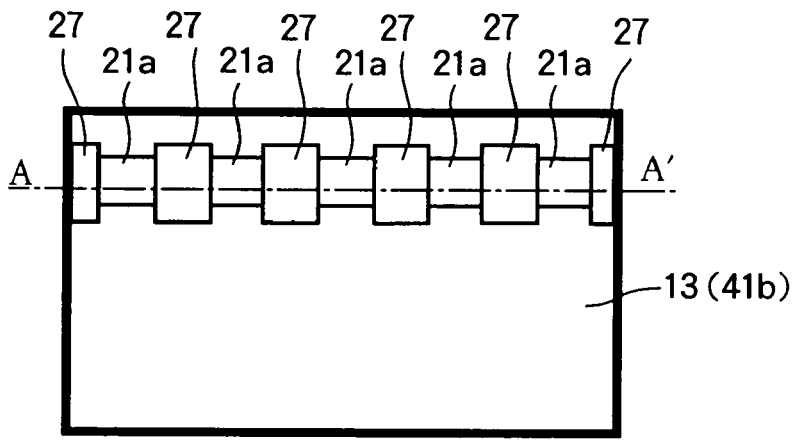
Figure 16B:
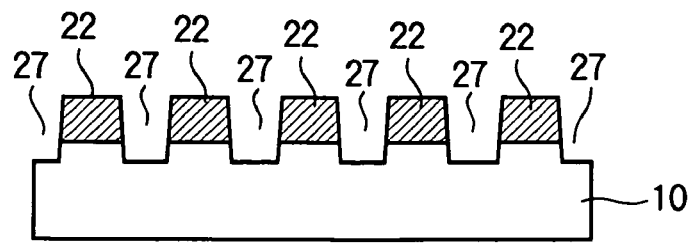

Referring to FIGS. 16A and 16B, the isolation trenches 27 are formed by, for example, photolithography and etching. Formation of the isolation trenches 27 removes part of the material of the diffusion region, which becomes divided into a plurality of mutually isolated diffusion regions 22, creating an array of light-emitting diodes having surfaces 21a of the desired size.

Figure 17A:
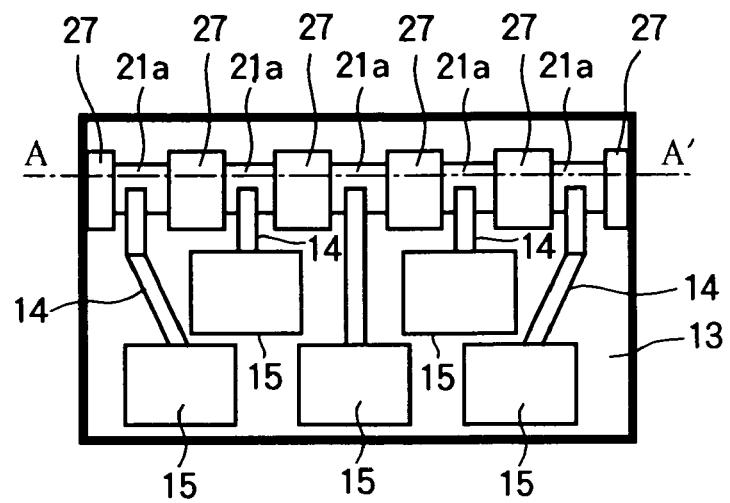
Figure 17B:
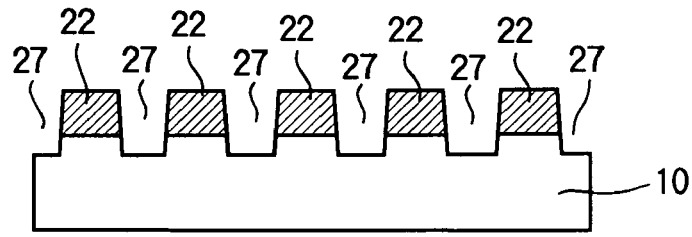

Referring to FIGS. 17A and 17B, the p-electrodes 14 and p-electrode pads 15 are formed as in the first embodiment.

Figure 18A:
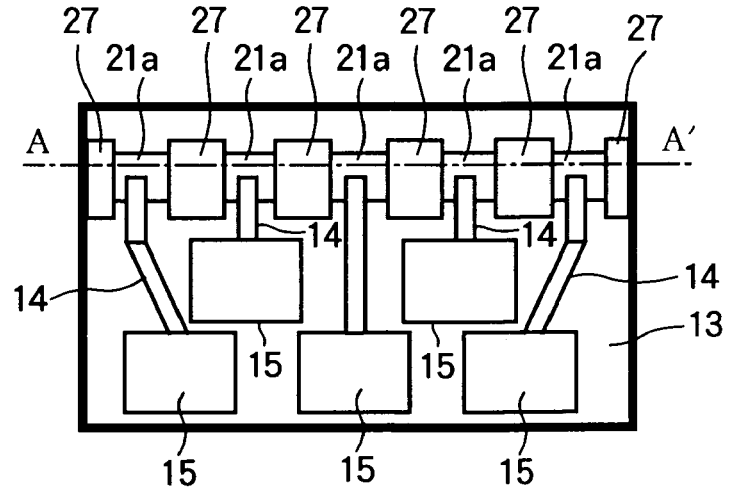
Figure 18B:
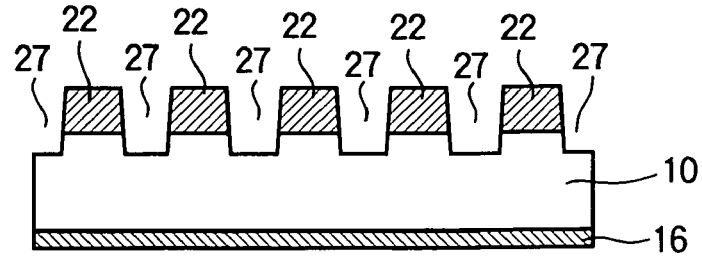

Referring to FIGS. 18A and 18B, the n-electrode 16 is formed as in the first embodiment.

Compared with the first embodiment, the second embodiment provides each light-emitting diode 21 with a larger pn junction area at the full junction depth, thereby permitting the surfaces 21a of the light-emitting diodes 21 to be smaller than in the first embodiment. The formation of all the light-emitting diodes 21 from a single diffusion region 22b also leads to more uniform light-emitting characteristics.

Next, a third embodiment will be described. The third embodiment is likewise an LED array.

Figure 19A:
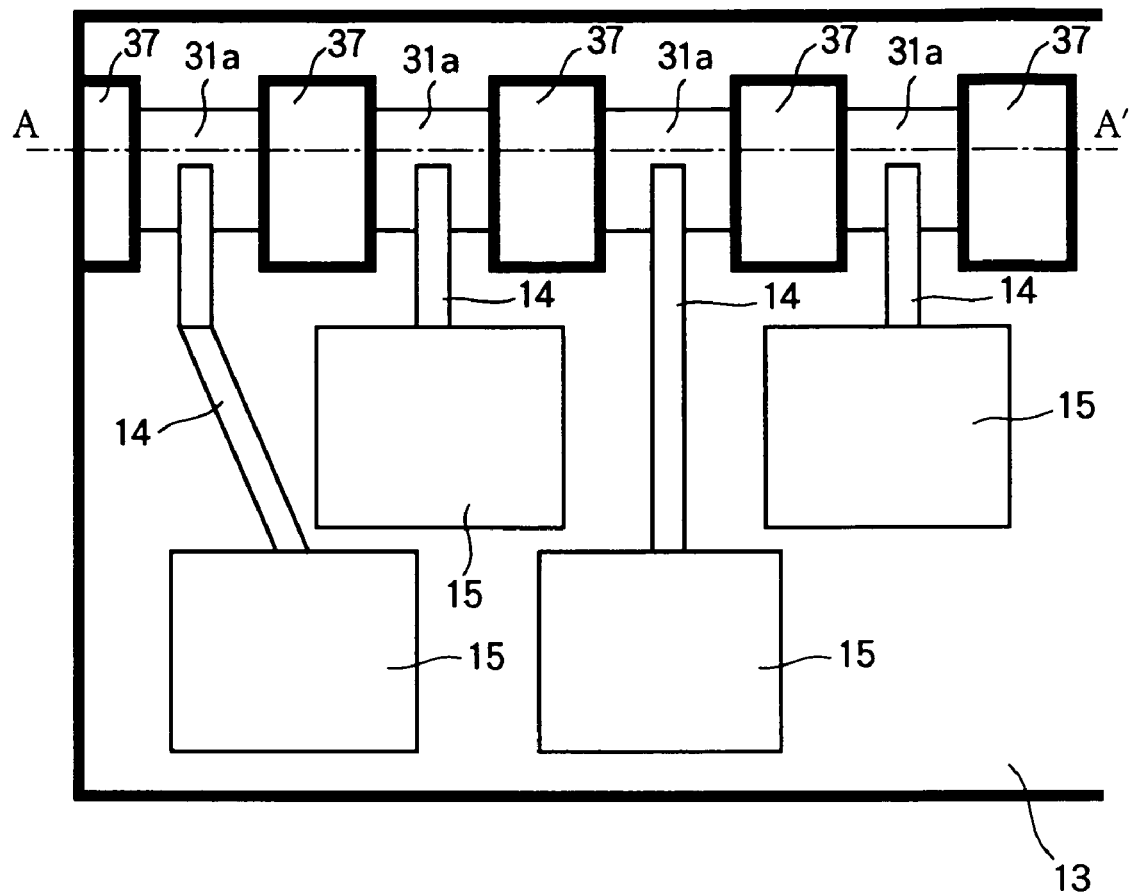
FIG. 19A is a plan view of an LED array according to a third embodiment of the invention.

Referring to FIG. 19A, the third embodiment has the same plan-view layout as the first embodiment, with the surfaces 31a of the light-emitting diodes separated by isolation trenches 37.

Figure 19B:
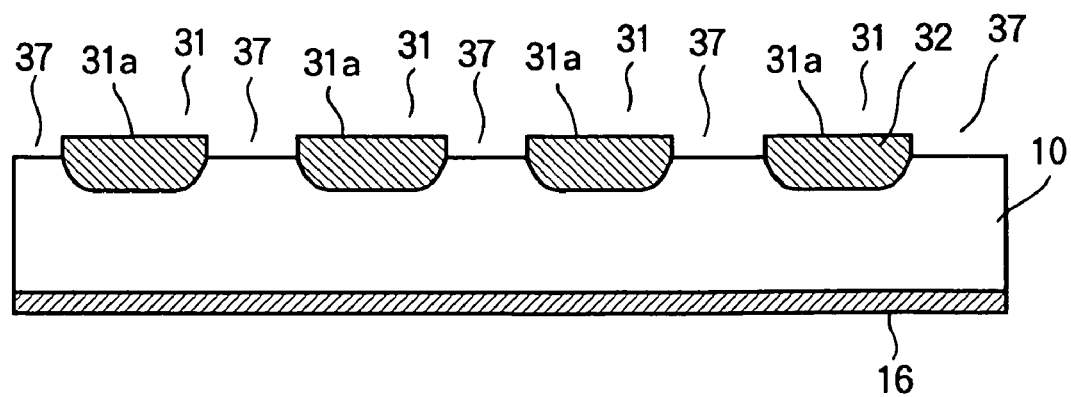
FIG. 19B is a sectional view through line A-A' in FIG. 19A.

Referring to FIG. 19B, the light-emitting diodes 31 in the third embodiment have substantially the same rounded cross-sectional shape as in the first embodiment, but the isolation trenches 37 in the third embodiment are not as deep as the diffusion regions 32 of the light-emitting diodes 31.

A fabrication process for the third embodiment will now be described.

Figure 20A:
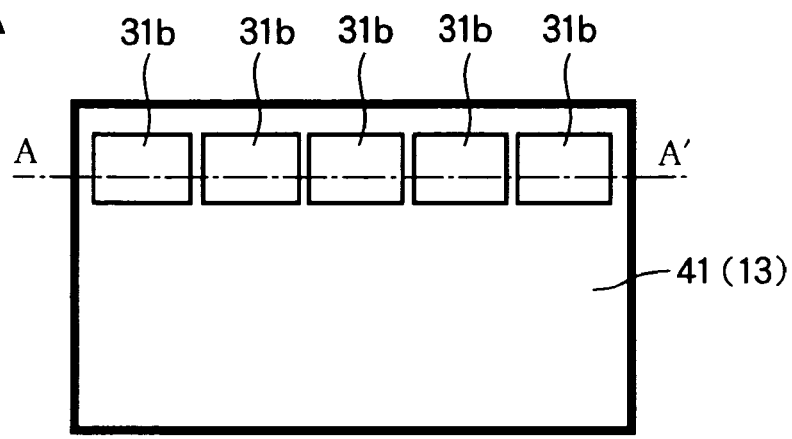
Figure 20B:
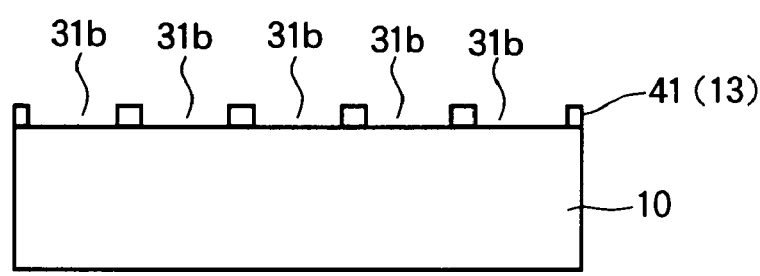

Referring to FIGS. 20A and 20B, a diffusion mask 41 is formed on the surface of the semiconductor substrate 10. The diffusion mask 41 may be used as the insulating layer 13 in the finished device. As in the first embodiment, the diffusion mask 41 has individual diffusion windows 31b defining the locations at which light-emitting diodes will be formed. The diffusion mask 41 may be, for example, a silicon nitride film 500 Å to 3000 Å thick formed by chemical vapor deposition. The diffusion windows 31b may be formed by photolithography and etching.

Figure 21A:
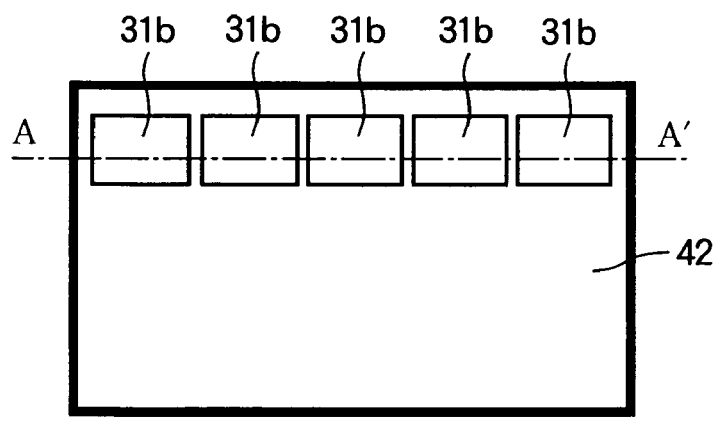
Figure 21B:
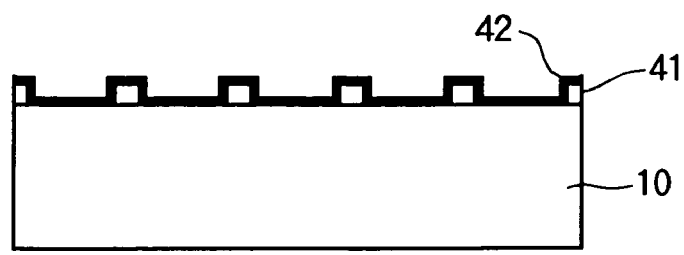

Referring to FIGS. 21A and 21B, a diffusion source 42 is deposited on the diffusion mask 41 and the diffusion windows 31b. The diffusion source 42 may be, for example, a sputtered ZnO—SiO$_2$ film 500 Å to 3000 Å thick.

Figure 22A:
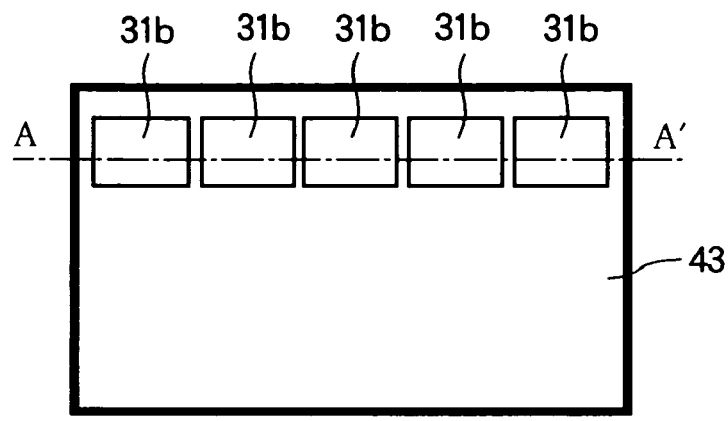
Figure 22B:
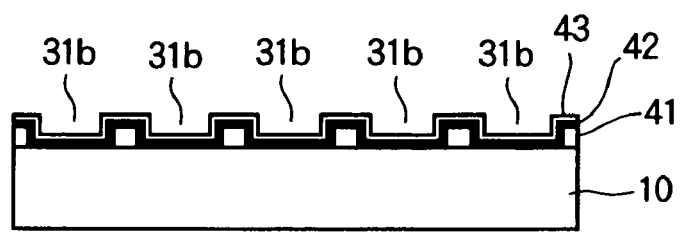

Referring to FIGS. 22A and 22B, an anneal cap 43 is formed on the diffusion source 42. The anneal cap 43 may be, for example, a sputtered aluminum nitride film 500 Å to 3000 Å thick.

Figure 23A:
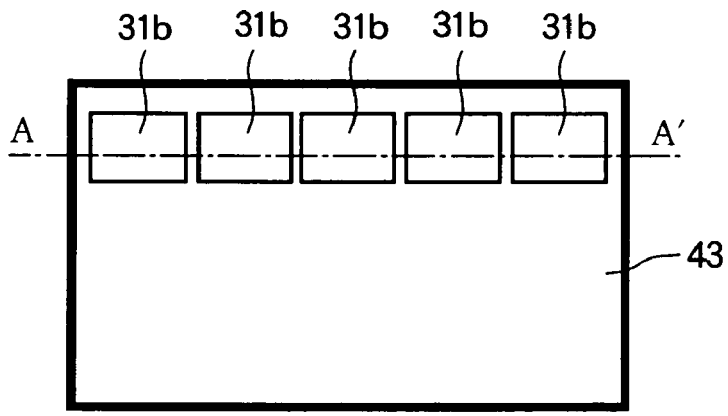
Figure 23B:
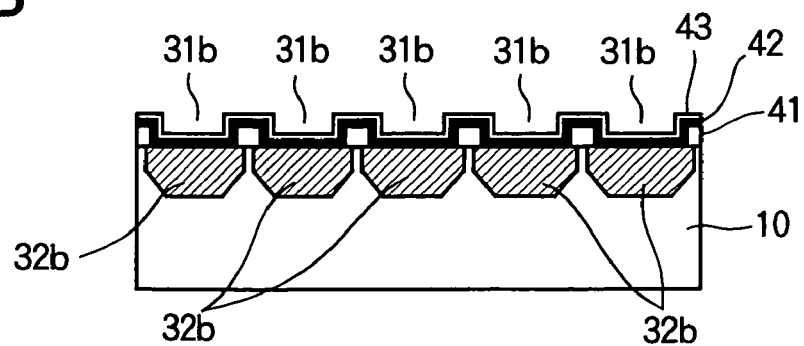

Referring to FIGS. 23A and 23B, the device is annealed in, for example, a nitrogen atmosphere for one hour, causing a p-type impurity (e.g., zinc) to diffuse through the diffusion windows 31b to a desired depth (e.g., 1.0 µm) in the semiconductor substrate 10, forming diffusion regions 32b.

Figure 24A:
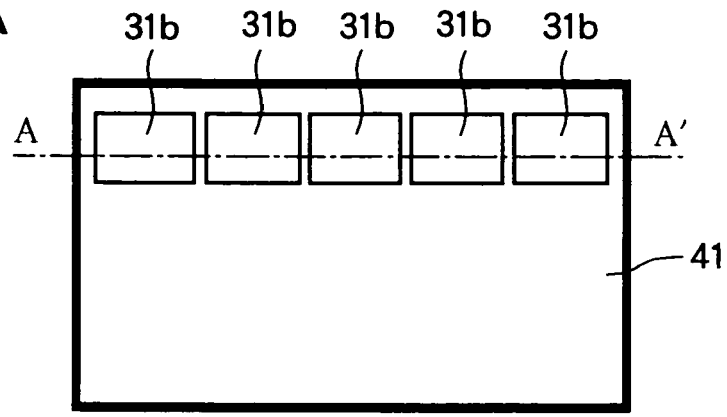
Figure 24B:
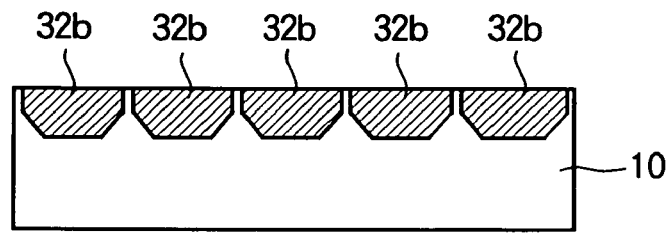

Referring to FIGS. 24A and 24B, the diffusion source 42 and anneal cap 43 are now removed, exposing the diffusion mask 41 and the surfaces of the diffusion regions 32b. The diffusion source 42 and anneal cap 43 may be removed by etching.

Figure 25A:
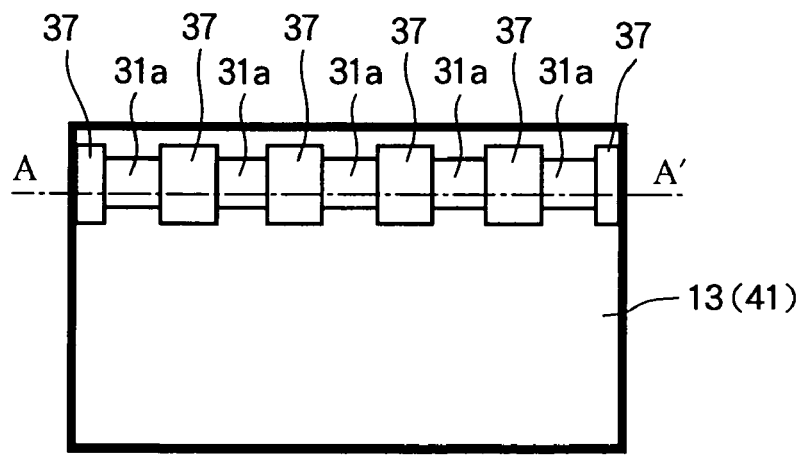
Figure 25B:
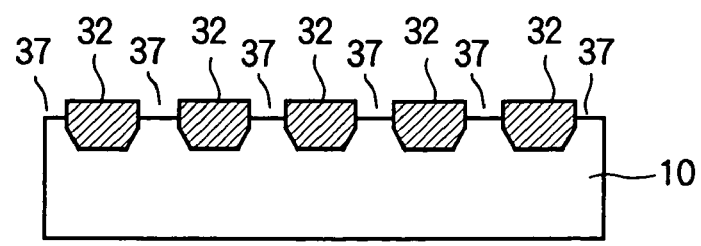

Referring to FIGS. 25A and 25B, the isolation trenches 37 are formed by, for example, photolithography and etching. Formation of the isolation trenches 27 removes part of the material from the upper sides of the diffusion regions 32b, reducing the surfaces 31a of the light-emitting diodes to a desired size, but the etching process is stopped before the lower parts of the diffusion regions 32b are reached. The remaining diffusion regions 32 thus have rounded bottoms.

Figure 26A:
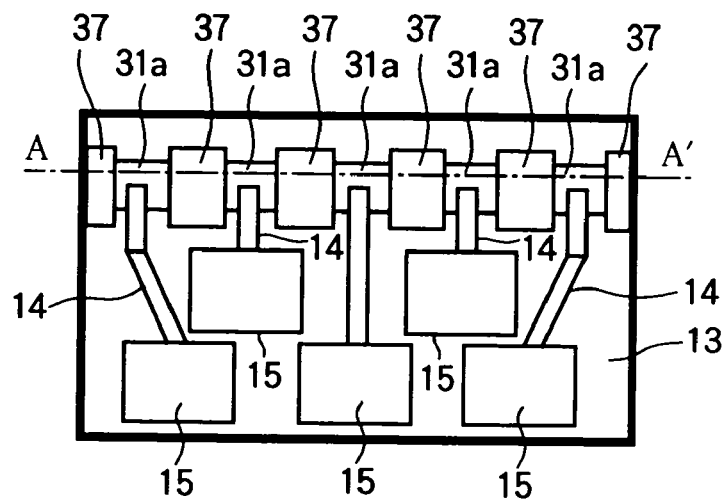
Figure 26B:
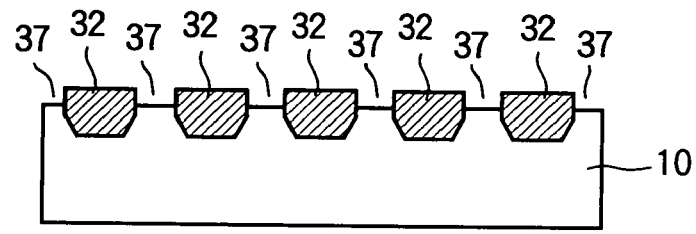

Referring to FIGS. 26A and 26B, the p-electrodes 14 and p-electrode pads 15 are formed as in the first embodiment.

Figure 27A:
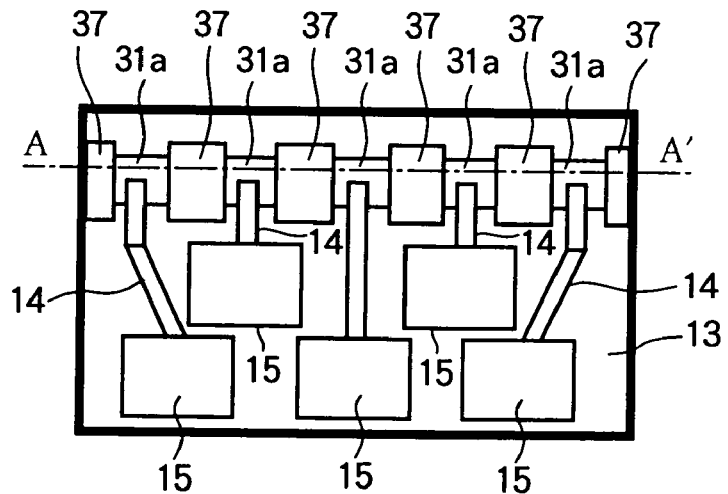
Figure 27B:
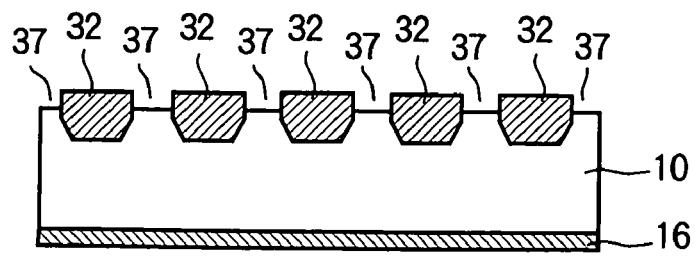
Figure 28A:
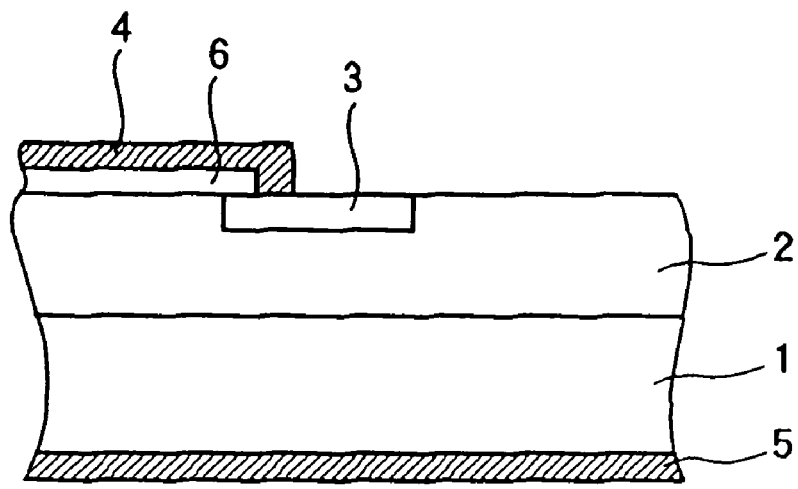
FIG. 28A is a sectional view of a light-emitting element in a conventional LED array.
Figure 28B:
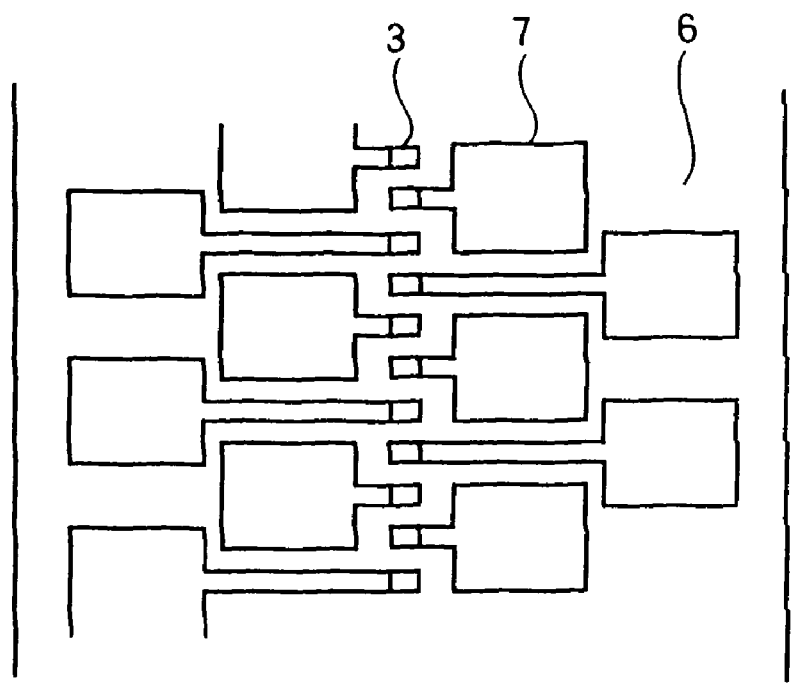
FIG. 28B is a plan view of a conventional LED array.
Figure 29:
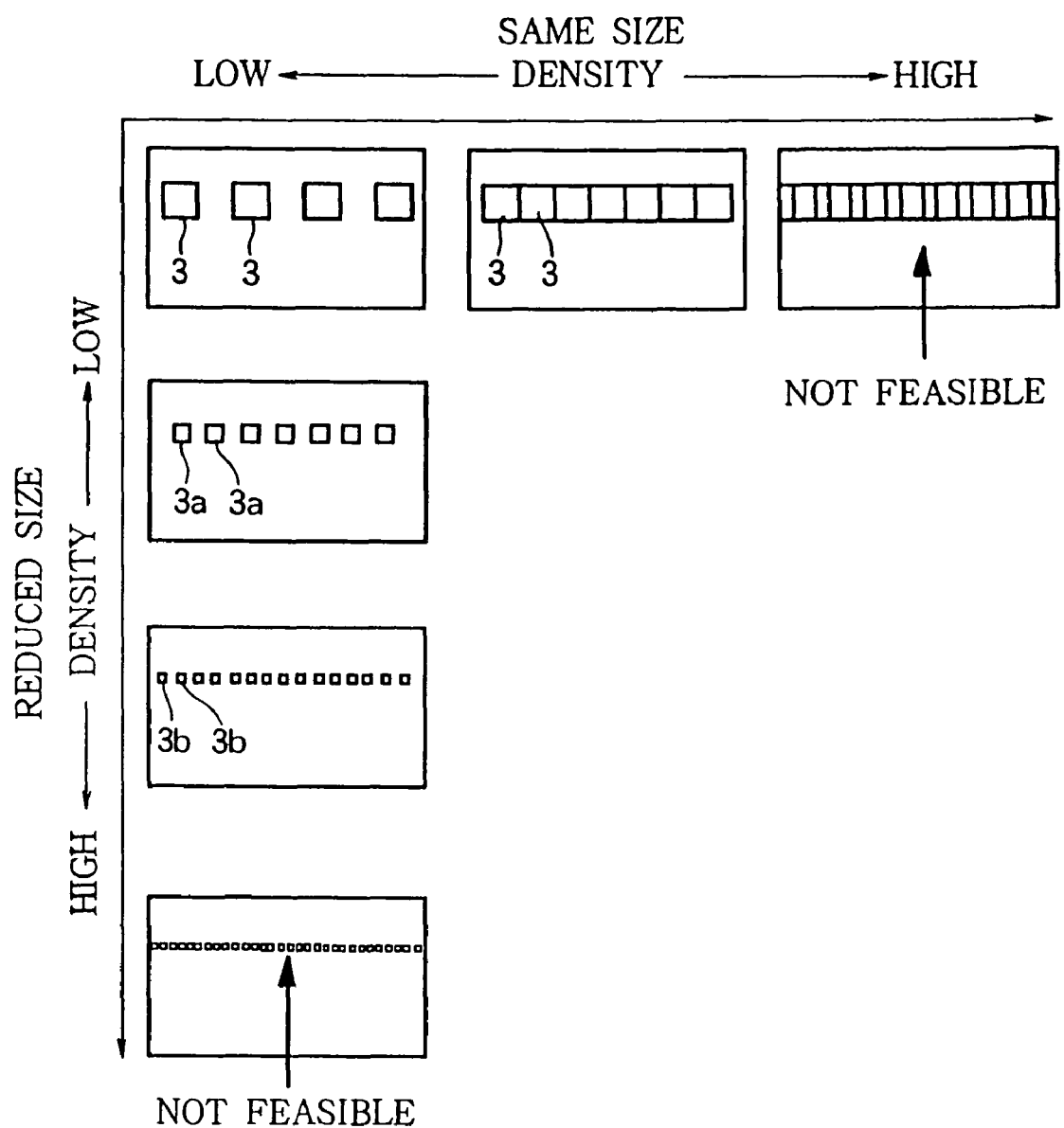
FIG. 29 illustrates factors limiting the density of a conventional LED array.
Figure 30:
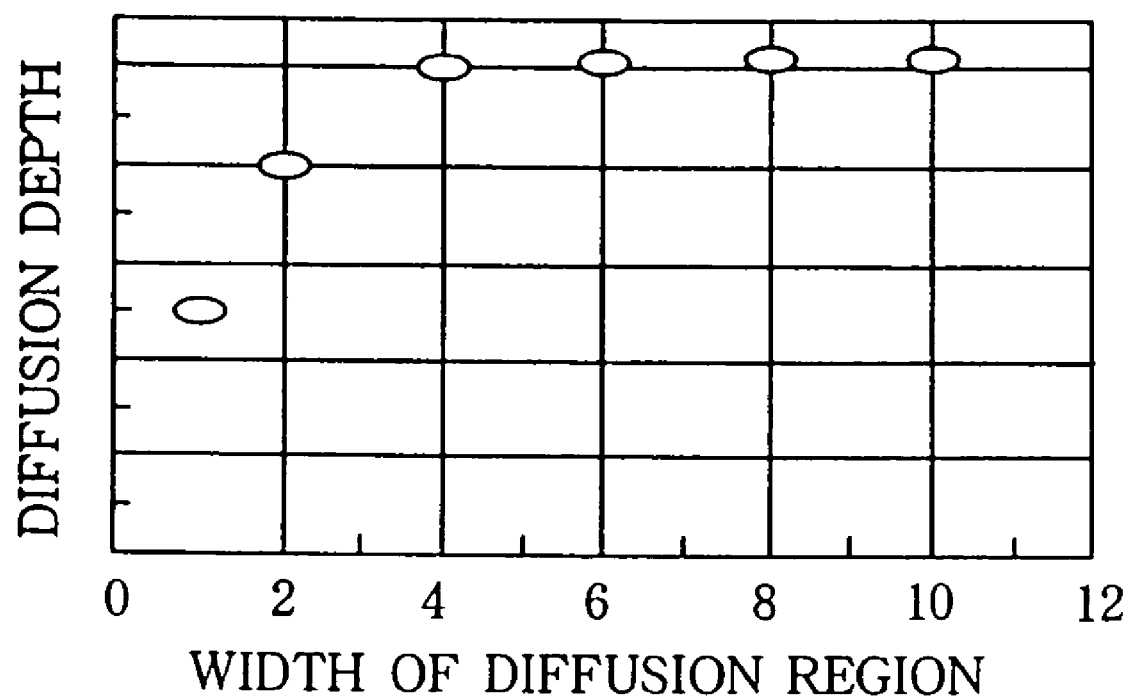
FIG. 30 is a graph of diffusion depth plotted against diffusion region width.

Referring to FIGS. 27A and 27B, the n-electrode 16 is formed as in the first embodiment.

The relative shallowness of the isolation trenches 37 in the third embodiment makes the etching process illustrated in FIGS. 25A and 25B easier to control than in the first embodiment. Consequently, if the surfaces 31a of the light-emitting diodes 31 in the third embodiment are equal in width to the surfaces 11a of the light-emitting diodes 11 in the first embodiment, the light-emitting diodes 31 can be placed closer together in the third embodiment than in the first embodiment.

The present invention is not limited to the embodiments described above; those skilled in the art will recognize that various modifications are possible. The scope of the invention should accordingly be determined from the appended claims.

What is claimed is:

1. A method of fabricating a semiconductor light-emitting device having a semiconductor substrate of a first conductive type, and a plurality of mutually isolated light-emitting regions of a second conductive type formed in the semiconductor substrate and disposed in an array along an array direction, the semiconductor substrate having peripheral edges that extend in the array direction, the method comprising:

diffusing an impurity of said second conductive type into a first part of a top surface of the semiconductor substrate, thereby forming at least one diffusion region having a diffusion depth sufficient for emission of a light with a desired intensity; and then removing material from the at least one diffusion region to form a plurality of isolation trenches, the isolation trenches, taken from a plan view of the semiconductor substrate, cutting through the at least one diffusion region in a first direction that is parallel to the top surface of the semiconductor substrate and perpendicular to the array direction and separating the at least one diffusion region into said mutually isolated light-emitting regions, the isolation trenches being as wide as or wider than the at least one diffusion region in the first direction, the at least one diffusion region and the isolation trenches being narrower than the substrate in the first direction, each of the isolation trenches being apart from the array-direction-extending peripheral edges of the semiconductor substrate; and after forming the isolation trenches, forming a plurality of electrode pads and a plurality of electrodes on a second part of the top surface of the semiconductor substrate, the electrode pads, taken from the plan view of the semiconductor substrate, being spaced apart from the diffusion region, the electrode pads being electrically coupled to the at least one diffusion region by the electrodes, the second part being different from the first part.

2. The method of claim 1, wherein the isolation trenches are formed between the light-emitting regions, and wherein each of the light-emitting regions, taken from the plan view of the semiconductor substrate, has array-direction-extending sides that extend parallel to the array direction, and wherein, taken from the plan view of the semiconductor substrate, the isolation trenches are not formed on the array-direction-extending sides of each light-emitting region.

3. The method of claim 1, wherein only one diffusion region is formed by the diffusing of the impurity of the second conductive type, the method further comprising:

forming a diffusion mask on the semiconductor substrate, the diffusion mask having single window with a predetermined width extending longitudinally in a second direction substantially orthogonal to the first direction.

4. The method of claim 3, wherein the isolation trenches are deeper than the diffusion depth of the light-emitting regions.

5. The method of claim 1, wherein a plurality of diffusion regions are formed by the diffusing of the impurity of the second conductive type.

6. The method of claim 5, wherein removing material from the at least one diffusion region includes removing side material from the diffusion regions.

7. The method of claim 5, wherein the isolation trenches are deeper than the diffusion depth of the light-emitting regions.

8. The method of claim 5, wherein the isolation trenches are shallower than the diffusion depth of the light-emitting regions.

9. The method of claim 5, further comprising forming a diffusion mask having a plurality of windows aligned in said array direction, the windows defining a plurality of mutually separated diffusion regions, wherein forming the plurality of isolation trenches further comprises removing material from mutually adjacent edges of the diffusion regions and removing material from spaces between the diffusion regions.

10. The method of claim 1, wherein the second part is offset in the first direction from the first part.

11. The method of claim 1, wherein each of the isolation trenches is formed between the light-emitting regions, isolating two adjacent light-emitting regions on both sides of the trench from each other throughout a width of each of the two adjacent light-emitting regions.

12. The method of claim 1, wherein the semiconductor light-emitting device is a final product, such that the semiconductor substrate is not further divided into separate pieces.

13. The method of claim 1, wherein the isolation trenches are formed by photolithography and etching.

14. The method of claim 1, wherein the isolation trenches are formed by etching away a portion of the first part of the top surface of the semiconductor substrate to a predetermined depth.

15. The method of claim 1, wherein each of the isolation trenches, taken from the plan view of the semiconductor substrate, has a left side, a right side, an upper side and a lower side, the upper and lower side being spaced apart from an outer periphery of the top surface of the semiconductor substrate.

16. The method of claim 15, wherein taken from the plan view of the semiconductor substrate, the upper and lower sides of the isolation trenches extend in the array direction.

17. The method of claim 1, wherein each of the electrode pads is wider than each of the light-emitting regions in the array direction.

18. The method of claim 1, wherein the trenches do not have any portion that is disposed between two electrode pads that are adjacent to each other in the array direction.

* * * * *